(12) United States Patent
Zou et al.

(10) Patent No.: US 10,896,927 B2
(45) Date of Patent: Jan. 19, 2021

(54) MICRO-LED TRANSFER METHOD, MANUFACTURING METHOD AND DEVICE

(71) Applicant: GOERTEK INC., Weifang (CN)

(72) Inventors: Quanbo Zou, Weifang (CN); Peixuan Chen, Weifang (CN); Xiangxu Feng, Weifang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 16/320,019

(22) PCT Filed: Aug. 22, 2016

(86) PCT No.: PCT/CN2016/096197
§ 371 (c)(1),
(2) Date: Jan. 23, 2019

(87) PCT Pub. No.: WO2018/035668
PCT Pub. Date: Mar. 1, 2018

(65) Prior Publication Data
US 2019/0267426 A1    Aug. 29, 2019

(51) Int. Cl.
*H01L 27/15*        (2006.01)
*H01L 33/62*        (2010.01)
*H01L 33/60*        (2010.01)
*H01L 33/00*        (2010.01)
*H01L 25/075*       (2006.01)

(52) U.S. Cl.
CPC .......... *H01L 27/153* (2013.01); *H01L 33/005* (2013.01); *H01L 33/0095* (2013.01); *H01L 33/60* (2013.01); *H01L 33/62* (2013.01); *H01L 25/0753* (2013.01); *H01L 2933/0033* (2013.01)

(58) Field of Classification Search
None
See application file for complete search history.

(56) References Cited

U.S. PATENT DOCUMENTS

| 5,611,140 A | 3/1997 | Kulesza et al. |
| 2011/0133216 A1* | 6/2011 | Sugawara ........... H01L 33/0079 257/88 |
| 2017/0162552 A1* | 6/2017 | Thompson ............ H01L 25/167 |

FOREIGN PATENT DOCUMENTS

| CN | 105493297 A | 4/2016 |
| CN | 105723528 A | 6/2016 |
| CN | 105870265 A | 8/2016 |
| WO | 2016183844 A1 | 11/2016 |

* cited by examiner

*Primary Examiner* — John A Bodnar
(74) *Attorney, Agent, or Firm* — Saliwanchik, Lloyd & Eisenschenk

(57) ABSTRACT

A micro-LED transfer method, manufacturing method and device are provided. The micro-LED transfer method comprises: obtaining a laser-transparent carrier substrate having a first surface and a second surface with micro-LEDs; forming a protection layer on at least one of the first surface and the second surface and a third surface of a receiving substrate, wherein the third surface is to receive the micro-LEDs to be transferred via pads; bringing the micro-LEDs to be transferred into contact with the pads on the third surface; and irradiating the micro-LEDs to be transferred with laser from the first surface to lift-off the micro-LEDs to be transferred from the carrier substrate wherein the protection layer configured to protect the third surface from the irradiation of the laser.

3 Claims, 7 Drawing Sheets

MICRO-LED TRANSFER METHOD, MANUFACTURING METHOD AND DEVICE

CROSS REFERENCE TO RELATED APPLICATIONS

This application is a National Stage of International Application No. PCT/CN2016/096197, filed on Aug. 22, 2016, which is hereby incorporated by reference in its entirety.

FIELD OF THE INVENTION

The present invention relates to the field of micro-LED, and in particular, relates to a micro-LED transfer method, a method for manufacturing a micro-LED device and a micro-LED device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market.

During manufacturing, the micro-LEDs shall be transferred from a carrier substrate to a receiving substrate. The receiving substrate is a display panel, for example. In the prior art, generally, complicated transfer head array such as an electro-static head array, an electro-magnetic head array, or a head array using micro-transfer printing (uTP) with molded PDMS, etc. are used in transferring massive micro-LED array. This, leads to a high manufacturing cost and a critical environmental requirement, and reliability/yield issues arise due to multiple thermal loadings.

Recently, the present inventors have proposed to use laser lift-off technology the micro-LED transfer. During the laser lift-off, a laser can go through a laser-transparent carrier substrate and reach the surface of the receiving substrate. The surface of the receiving substrate may include some circuitry. The laser might cause potential damage to the circuitry.

FIG. 1 shows a situation of an oversized laser beam. In FIG. 1, some of the laser 107 goes through a laser-transparent carrier substrate 101 such as a sapphire substrate and reaches the circuitry 105 on the surface of the receiving substrate 102. The circuitry 105 can include TFT (Thin-film transistor), for example. The carrier substrate is a sapphire substrate, for example. As shown in FIG. 1, micro-LEDs 103 are formed on the carrier substrate 101. The micro-LEDs 103*a*, 103*b* to be transferred are bonded with the pads (such as anodes) 104 on the circuitry 105 of the receiving substrate 102 via solder 106. The section area of the laser 107 is larger than that of the micro-LEDs 103*a*, 103*b*, so that some laser is leaked and reaches the circuitry 105 and might cause damage to the circuitry 105.

FIG. 2 shows a situation of an undersized laser beam. In FIG. 2, micro-LEDs 203 are formed on the carrier substrate 201. The micro-LEDs 203*a*, 203*b* are bonded with pads 204 on the circuitry 205 of the receiving substrate 202 via solder 206. The section area of the laser 207 is smaller than that of the micro-LEDs 103*a*, 103*b* so that the laser will not reach the circuitry 205. This processing requires a high precision bonding and laser alignment, which might be a bottleneck for small micro-LED transfer, such as during manufacturing micro-LEDs with a size smaller than a few microns.

Therefore, there is a demand in the art that a new micro-LED transfer solution shall be proposed to address at least one of the problems in the prior art.

SUMMARY OF THE INVENTION

One object of this invention is to provide a new technical solution for micro-LED transfer.

According to a first aspect of the present invention, there is provided a micro-LED transfer method, comprising: obtaining a carrier substrate, wherein the carrier substrate is laser-transparent and has a first surface and a second surface which is opposite to the first surface, and micro-LEDs to be transferred are formed on the second surface; forming a protection layer on at least one of the first surface and the second surface of the carrier substrate and a third surface of a receiving substrate, wherein the third surface of the receiving substrate is configured to receive the micro-LEDs to be transferred via pads; bringing the micro-LEDs to be transferred into contact with the pads on the third surface; and irradiating the micro-LEDs to be transferred with laser from the first surface to lift-off the micro-LEDs to be transferred from the carrier substrate, wherein the protection layer is configured to protect the third surface from the irradiation of the laser.

Alternatively or in addition, the protection layer is a mask formed on the first surface and is configured to let the laser go through areas corresponding the micro-LEDs to be transferred.

Alternatively or in addition, the protection layer is formed on at least one of the second surface and the third surface.

Alternatively or in addition, the protection layer is formed on the second surface in gaps among micro-LEDs on the second surface.

Alternatively or in addition, the protection layer is formed on the third surface in a blanket manner without mask patterning and is conductive, and the protection layer covers the pads, and the method further comprises: removing the protection layer between micro-LEDs on the third surface after lifting-off the micro-LEDs to be transferred.

Alternatively or in addition, the protection layer is formed on the third surface in a patterned manner in which the protection layer corresponds to gaps among micro-LEDs on the second surface.

Alternatively or in addition, the protection layer is at least one of a patterned metal, a patterned polymer and a dielectric Distributed Bragg Reflector.

Alternatively or in addition, the protection layer is formed on the pads on the third surface and is conductive, and the protection layer on a pad has an area larger than that of the micro-LEDs to be transferred on the second surface.

According to a second aspect of the present invention, there is provided a method for manufacturing a micro-LED device, comprising transferring micro-LEDs on a carrier substrate to a receiving substrate by using the micro-LED transfer method according to the present invention.

According to a third aspect of the present invention, there is provided a micro-LED device, which is manufactured by using the method according to the present invention.

According to an embodiment of this invention, a protection is provided to the circuitry on the receiving substrate to avoid a potential damage.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
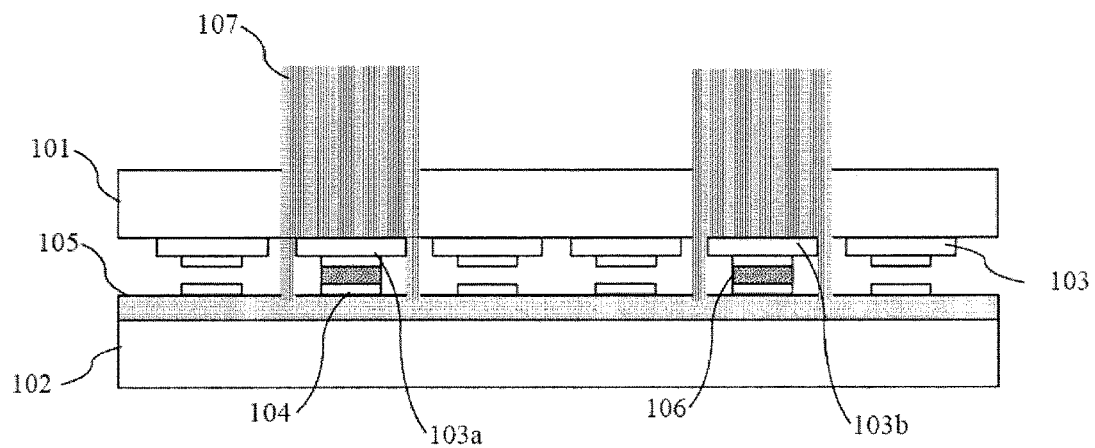
FIG. 1 shows a schematic diagram of micro-LED transfer using an oversized laser beam.
Figure 2:
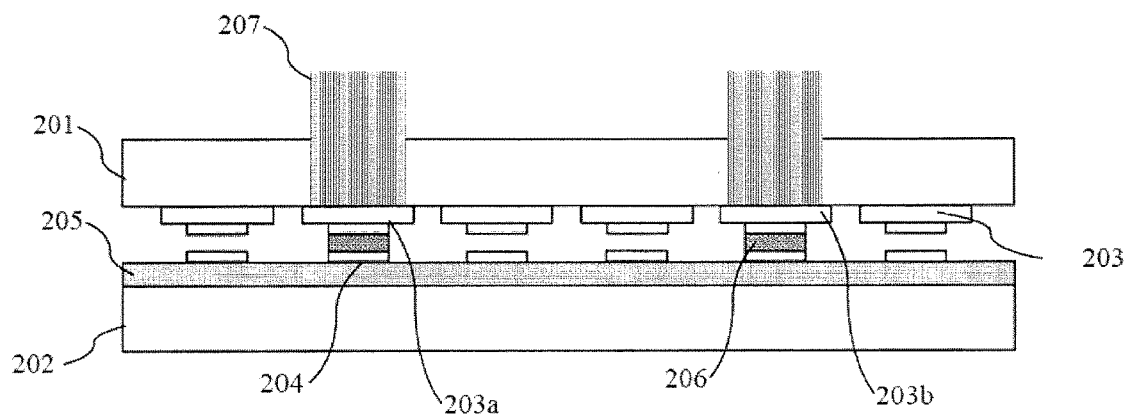
FIG. 2 shows a schematic diagram of micro-LED transfer using an undersized laser beam.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the embodiments, a protection layer is formed between the surface of the receiving substrate and the laser source during the transfer such that the likelihood of damage will be reduced. Furthermore, it has a less complexity than that of the processing using the undersized laser beam.

The micro-LED transfer method according to the embodiments of the present invention comprises: obtaining a carrier substrate, wherein the carrier substrate is laser-transparent and has a first surface and a second surface which is opposite to the first surface, and micro-LEDs to be transferred are formed on the second surface; forming a protection layer on at least one of the first surface and the second surface of the carrier substrate and a third surface of a receiving substrate, wherein the third surface of the receiving substrate is configured to receive the micro-LEDs to be transferred via pads; bringing the micro-LEDs to be transferred into contact with the pads on the third surface; and irradiating the micro-LEDs to be transferred with laser from the first surface to lift-off the micro-LEDs to be transferred from the carrier substrate, wherein the protection layer is configured to protect the third surface from the irradiation of the laser.

Further embodiments and examples will be described with reference to FIGS. 3-7.

First Embodiment

In the first embodiment, the protection layer is a mask formed on the first surface of the carrier substrate and is configured to let the laser go through areas corresponding the micro-LEDs to be transferred.

Figure 3:
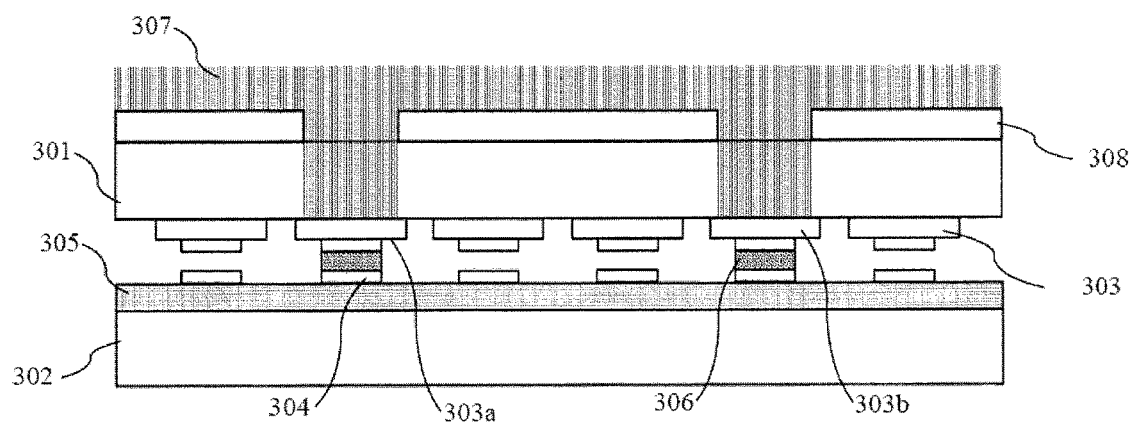
FIG. 3 shows a schematic diagram of micro-LED transfer according to a first embodiment of the present invention.

FIG. 3 shows a schematic diagram of micro-LED transfer according to the first embodiment of the present invention.

FIG. 3 shows a carrier substrate 301 and a receiving substrate 302. The carrier substrate 301 is laser-transparent and has a first surface and a second surface which is opposite to the first surface. Micro-LEDs 303 are formed on the second surface. A third surface is a surface of the receiving substrate 302 which is configured to receive the micro-LEDs to be transferred 303a, 303b via pads 304. The micro-LEDs to be transferred 303a, 303b are brought into contact with the pads 304 on the third surface, for example, via solder 306.

A mask 308 is formed on the first surface of the carrier substrate 301. Openings are formed in the mask to let laser 307 go through. In an example, the openings have a section area smaller than that of the micro-LEDs to be transferred 303a, 303b such that no laser will be leaked onto the third surface of the receiving substrate 302. For example, the section area of the opening is smaller than that of the epitaxy layer of the micro-LED 303.

As shown in FIG. 3, the micro-LEDs to be transferred 303a, 303b are irradiated with laser 307 from the first surface to lift-off the micro-LEDs to be transferred 303a, 303b from the carrier substrate 301. The protection layer 308 protect the third surface (such as the circuitry layer 305) of the receiving substrate 302 from the irradiation of the laser 307.

The mask used in this embodiment can be simple photoresist and/or hard masking (such as a metal thin film) patterned by photolithography. The mask can be easily stripped afterwards. This protection solution using a mask can be low cost.

In the following descriptions, repetitive contents will be omitted.

Second Embodiment

The protection layer can be formed on at least one of the second surface of the carrier substrate and the third surface of the receiving substrate. In the second embodiment, the protection layer is formed on the second surface in gaps among micro-LEDs on the second surface.

Figure 4A:
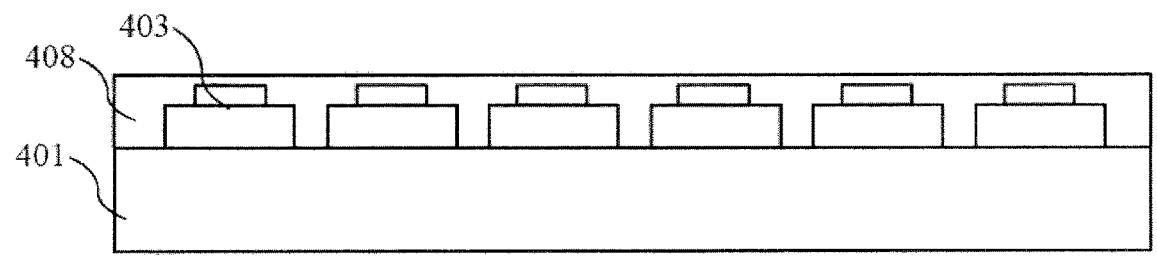
FIGS. 4A-4C show a schematic diagram of micro-LED transfer according to a second embodiment of the present invention.
Figure 4B:
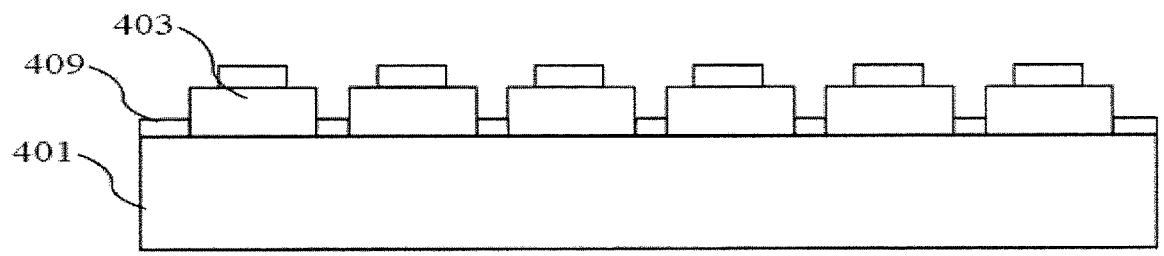
Figure 4C:
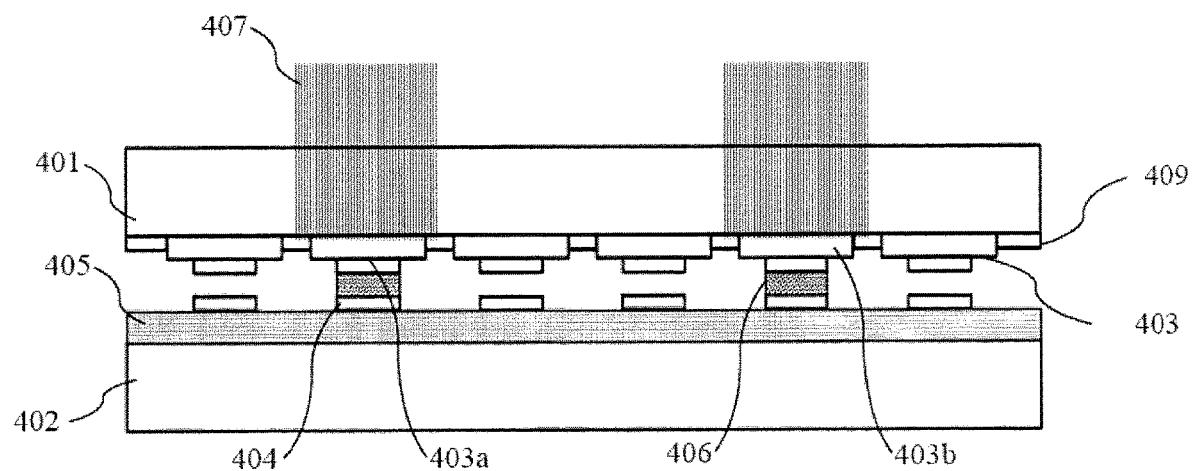

FIGS. 4A-4C show a schematic diagram of micro-LED transfer according to the second embodiment of the present invention.

As shown in FIG. 4A, micro-LEDs 403 are formed on the carrier substrate 401. A protection material 408 is formed on the carrier substrate 401. The protection material 408 can be resist, polymer, etc. The resist can be spin-coated and baked on the carrier substrate 401 (micro-LEDs 403). The polymer can be spin-coated and cured.

As shown in FIG. 4B, the protection material 408 is etched back to leave a protection layer 409 in the gaps among micro-LEDs 403. The protection layer 409 can be a thin layer with a thickness of 0.5-2 µm.

As shown in FIG. 4C, the micro-LEDs to be transferred 403a, 403b are brought into contact with the pads 404 on the third surface of the receiving substrate 402, for example, via solder 406. A circuitry layer 405 is formed on the receiving substrate 402. The micro-LEDs to be transferred 403a, 403b are irradiated with laser 407 from the first surface to lift-off the micro-LEDs to be transferred 403a, 403b from the carrier substrate 401. Because of the protection layer 409, less or no leak laser will reach the circuitry layer 405.

The protection layer 409 can be re-used in following transfers. Alternatively, it can be re-formed in following transfers.

In this embodiment, an oversized laser beam can be used. It can provide an easy control in manufacturing.

Third Embodiment

In the third embodiment, the protection layer is formed on the third surface in a blanket manner without mask patterning and is conductive. The protection layer covers the pads. The protection layer between micro-LEDs on the third surface is removed after the micro-LEDs to be transferred are lifted-off.

FIGS. 5A-5E show a schematic diagram of micro-LED transfer according to the third embodiment of the present invention.

Figure 5A:
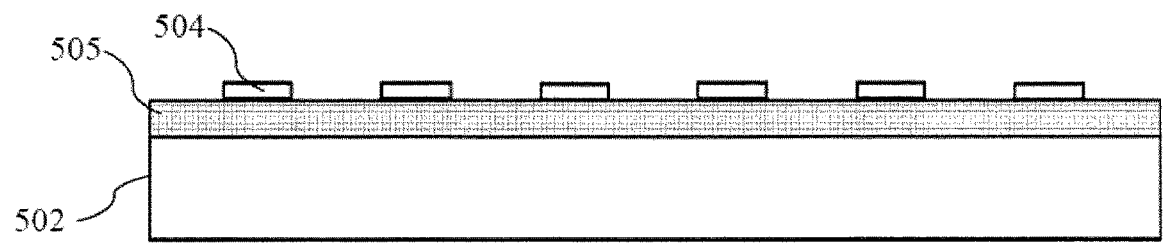
FIGS. 5A-5E show a schematic diagram of micro-LED transfer according to a third embodiment of the present invention.

As shown in FIG. 5A, pads 504 are formed on a receiving substrate 502. A circuitry layer 505 is also formed on the receiving substrate 502.

Figure 5B:
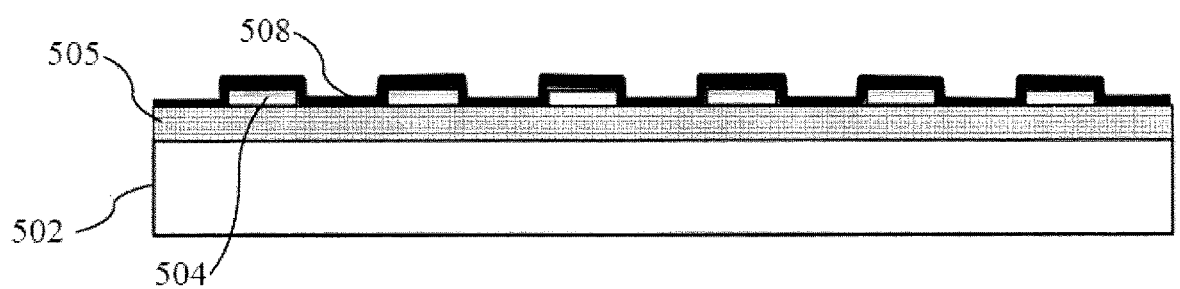

As shown in FIG. 5B, a protection layer 508 is formed on the receiving substrate 502 in a blanket manner without mask patterning. The protection layer 508 is conductive. It can be of metal and can be deposited in stacks.

Figure 5C:
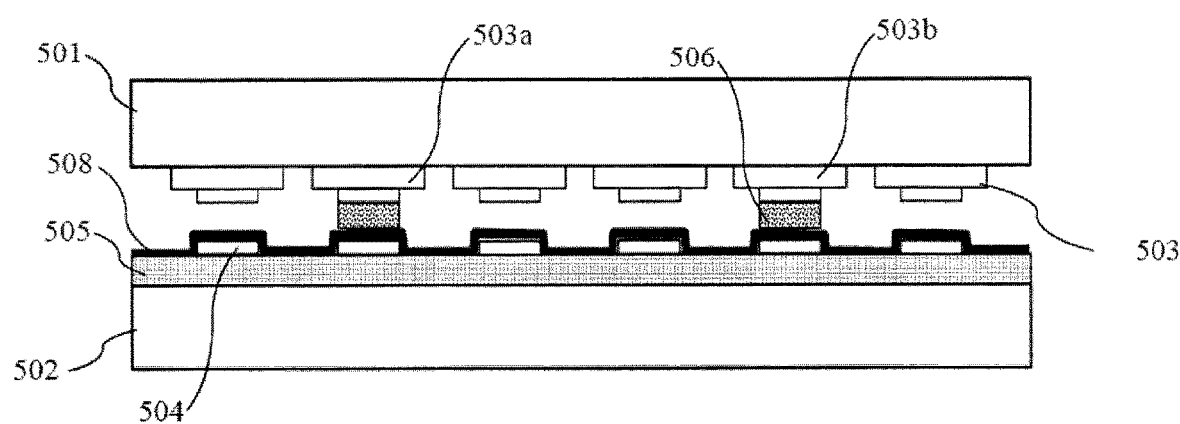

As shown in FIG. 5C, the micro-LEDs to be transferred 503a, 503b are brought into contact with pads 504, for example via solder 506 and the protection layer 508. Micro-LEDs 503 are formed on a carrier substrate 501.

Figure 5D:
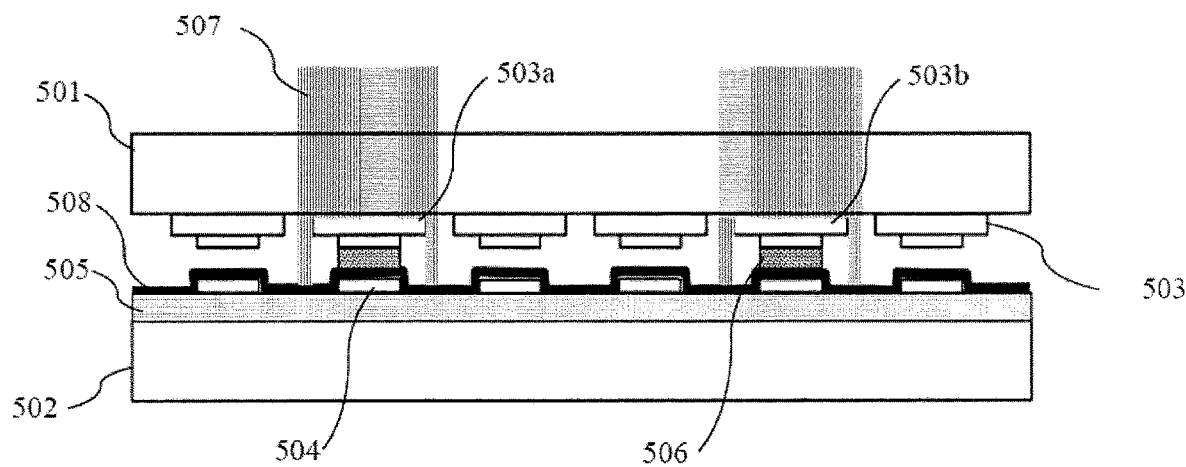

As shown in FIG. 5D, the micro-LEDs to be transferred 503a, 503b are irradiated with laser 507 from the first surface to lift-off the micro-LEDs to be transferred 503a, 503b from the carrier substrate 501. Because of the protection layer 508, less or no leak laser will reach the circuitry layer 505.

Figure 5E:
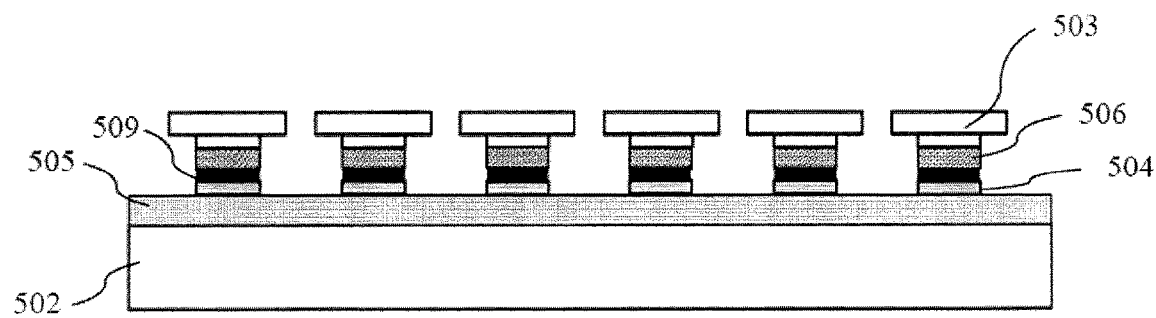

As shown in FIG. 5E, after transfer, the protection layer 508 between micro-LEDs on the third surface of the receiving substrate 502 is removed. The conductive protection layer 509 is left between the micro-LEDs 503 and the pads 504.

Fourth Embodiment

In the fourth embodiment, the protection layer is formed on the third surface in a patterned manner in which the protection layer corresponds to gaps among micro-LEDs on the second surface. For example, the protection layer is at least one of a patterned metal, a patterned polymer and a dielectric Distributed Bragg Reflector.

FIGS. 6A-6E show a schematic diagram of micro-LED transfer according to the fourth embodiment of the present invention.

Figure 6A:
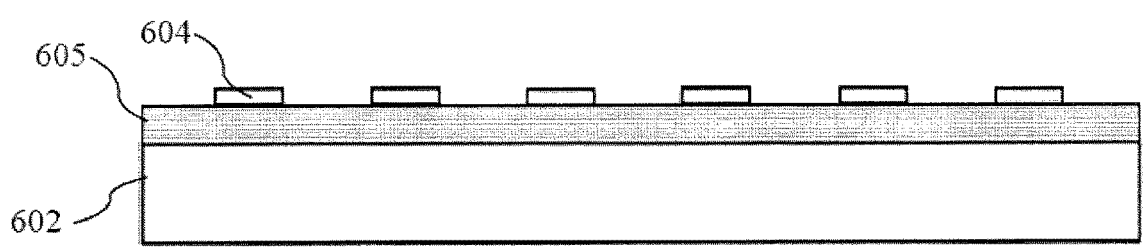
FIGS. 6A-6E show a schematic diagram of micro-LED transfer according to a fourth embodiment of the present invention.

As shown in FIG. 6A, pads 604 are formed on a receiving substrate 602. A circuitry layer 605 is also formed on the receiving substrate 602.

Figure 6B:
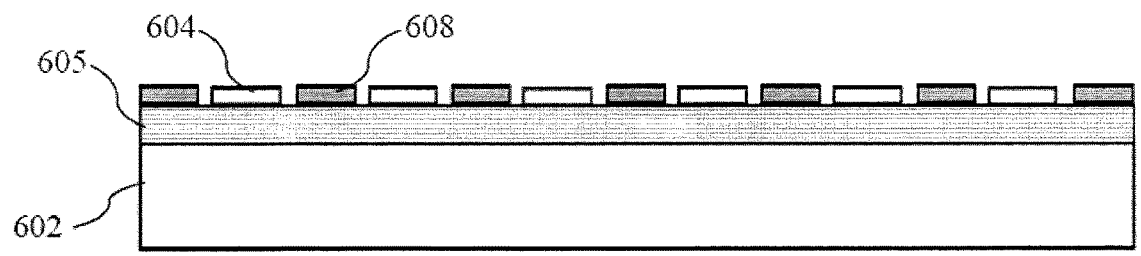

As shown in FIG. 6B, a protection layer 608 is formed on the receiving substrate 602 in in a patterned manner in which the protection layer 608 will correspond to gaps among micro-LEDs on the second surface of a carrier substrate 601. The protection layer 508 can be of metal and can be deposited in stacks. It can also be polymer. In an example, it can be a dielectric Distributed Bragg Reflector. The protection layer can larger than, equal to, or smaller than the gaps as long as it can protect at least a part of the circuitry layer 605.

Figure 6C:
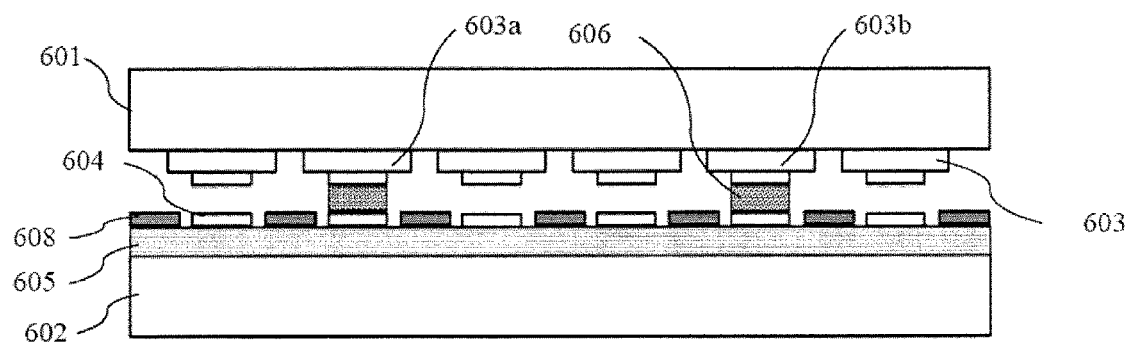

As shown in FIG. 6C, the micro-LEDs to be transferred 603a, 603b are brought into contact with pads 604, for example, via solder 606. Micro-LEDs 603 are formed on a carrier substrate 601.

Figure 6D:
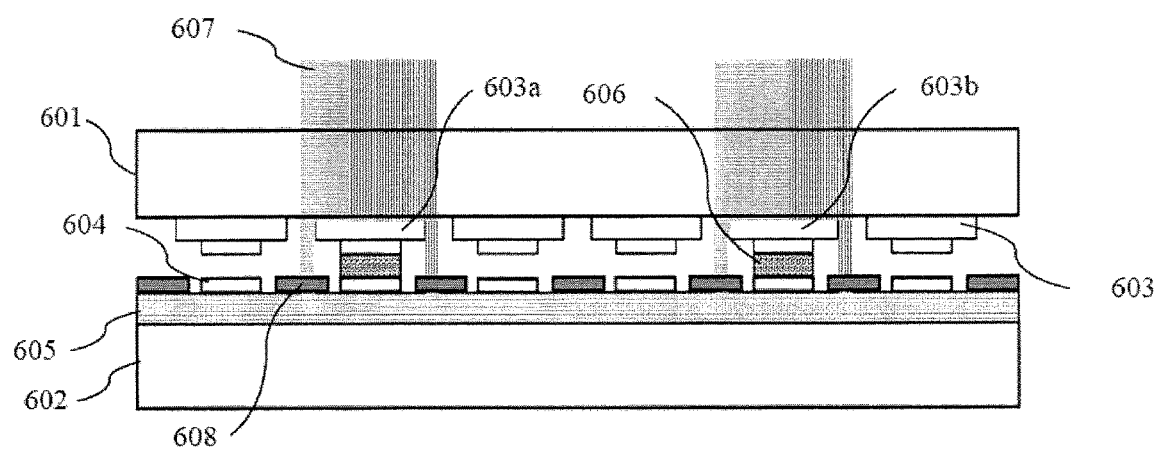

As shown in FIG. 6D, the micro-LEDs to be transferred 603a, 603b are irradiated with laser 607 from the first surface to lift-off the micro-LEDs to be transferred 603a, 603b from the carrier substrate 601. Because of the protection layer 608, less or no leak laser will reach the circuitry layer 605.

Figure 6E:
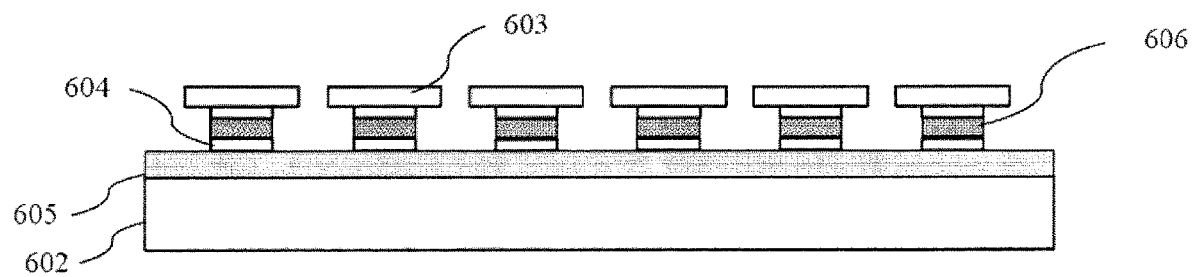

As shown in FIG. 6E, after transfer, the protection layer 608 between micro-LEDs on the third surface of the receiving substrate 602 is removed. Alternatively, the process of FIG. 6E can be omitted and the protection layer 608 can be kept in on the receiving substrate, for example, if the protection layer 608 is not conductive.

Fifth Embodiment

In the fifth embodiment, the protection layer is formed on the pads on the third surface and is conductive, and the protection layer on a pad has an area larger than that of the micro-LEDs to be transferred on the second surface.

In this embodiment, because the area of the protection layer on a pad is larger than that of the micro-LEDs, the likelihood that laser damages the circuitry on the receiving substrate will be reduced. For example, the area of a pad can also be larger than that of the micro-LEDs.

FIGS. 7A-7E show a schematic diagram of micro-LED transfer according to a fifth embodiment of the present invention.

Figure 7A:
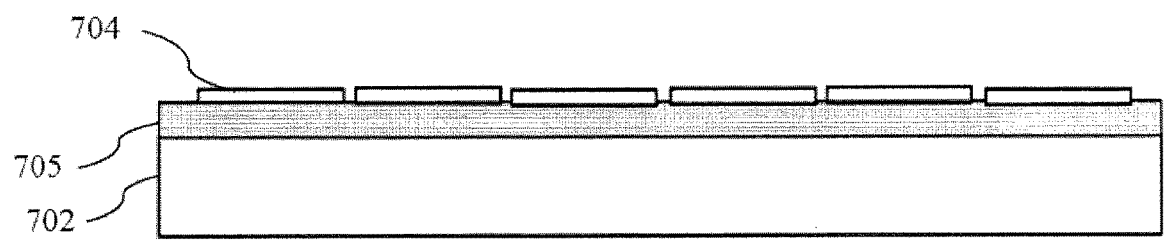
FIGS. 7A-7E show a schematic diagram of micro-LED transfer according to a fifth embodiment of the present invention.

As shown in FIG. 7A, pads 704 are formed on a receiving substrate 702. A circuitry layer 705 is also formed on the receiving substrate 702.

Figure 7B:
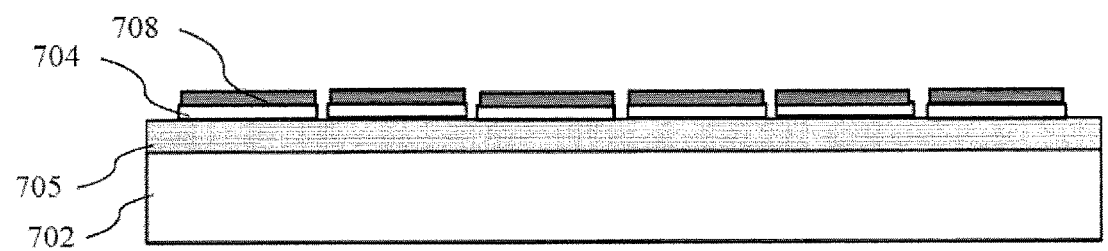

As shown in FIG. 7B, a protection layer 708 is formed on the pads the receiving substrate 702. The protection layer 708 is conductive. It can be of metal and can be deposited in stacks. For example, it can be Cr.

In FIG. 7B, the pad 704 and the protection layer 708 on a pad have similar area. However, they can have different areas as long as the protection layer on a pad is larger than the micro-LEDs. For example, the protection layer 708 on a pad can be larger than, equal to, or smaller than a pad.

Figure 7C:
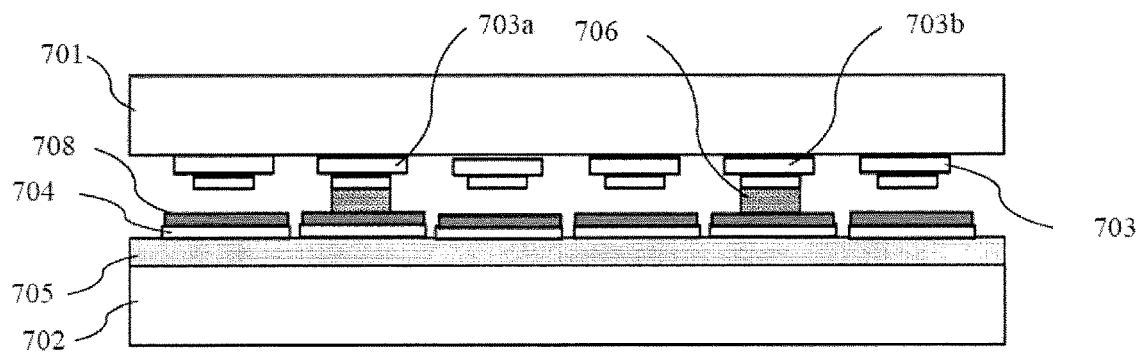

As shown in FIG. 7C, the micro-LEDs to be transferred 703a, 703b are brought into contact with pads 704, for example via solder 706 and the protection layer 708. Micro-LEDs 703 are formed on a carrier substrate 701.

Figure 7D:
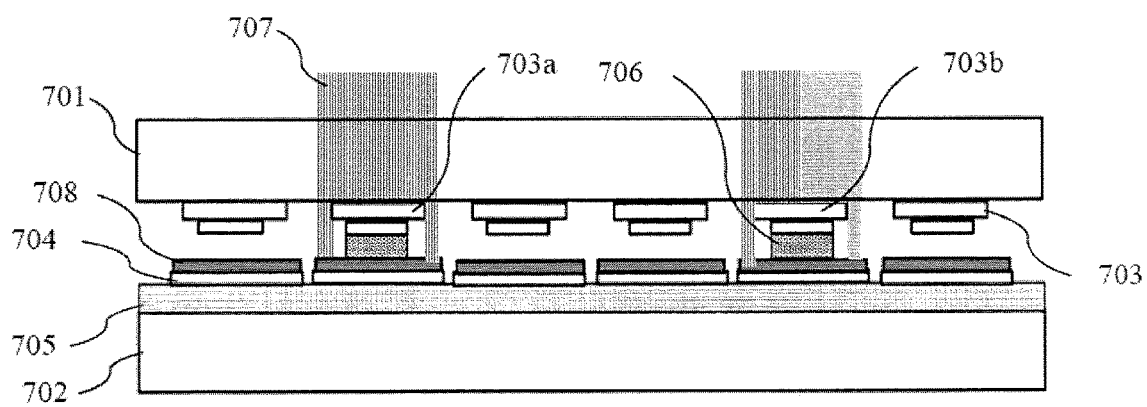

As shown in FIG. 7D, the micro-LEDs to be transferred 703a, 703b are irradiated with laser 707 from the first surface to lift-off the micro-LEDs to be transferred 703a, 703b from the carrier substrate 701. Because of the protection layer 708, less or no leak laser will reach the circuitry layer 705.

Figure 7E:
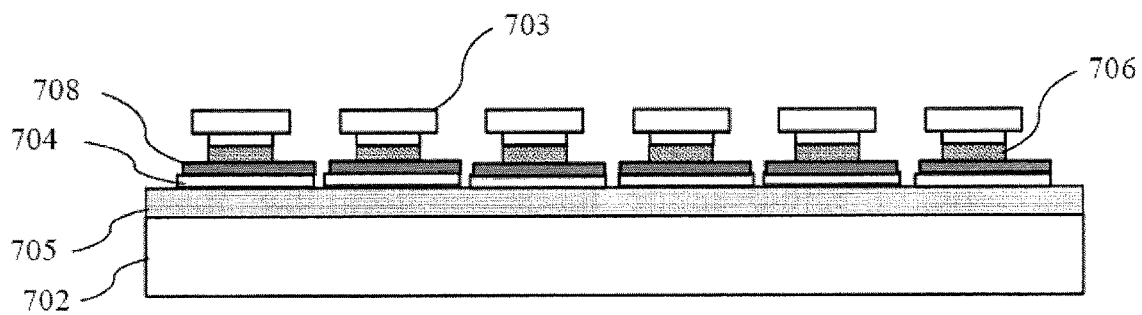

As shown in FIG. 7E, after transfer, the protection layer 708 is left between the micro-LEDs 703 and the pads 704.

In comparison with the solutions of the prior art, the solutions in the embodiments can reduce the likelihood of damage by leaking laser.

Furthermore, the solutions in the embodiments can provide a relatively easy control for laser lifting-off during micro-LED transfer.

In another embodiment, the present invention further provides a method for manufacturing a micro-LED device. The manufacturing method comprises transferring micro-LEDs to a receiving substrate by using the micro-LED transfer method according to the embodiments of the present invention. For example, the receiving substrate is a display panel, a display screen or display substrate. The micro-LED device is a display device, for example.

In another embodiment, the present invention further provides a micro-LED device, such as a display device. The micro-LED device can be manufactured by using the method for manufacturing a micro-LED device according to the embodiments of the present invention. In the micro-LED device according to the embodiments, the circuitry on the receiving substrate are protected by a protection layer such that a better micro-LED may be provided.

In another embodiment, the present invention further provides an electronic apparatus. The electronic apparatus contains a micro-LED device according to the embodiment. For example, the electronic apparatus can be a mobile phone, a pad and so on.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A micro-LED transfer method, comprising:
   obtaining a carrier substrate, wherein the carrier substrate is laser-transparent and has a first surface and a second surface which is opposite to the first surface, and micro-LEDs to be transferred are formed on the second surface;
   forming a protection layer on a third surface of a receiving substrate, wherein the third surface of the receiving substrate is configured to receive the micro-LEDs to be transferred via pads;
   bringing the micro-LEDs to be transferred into contact with the pads on the third surface; and
   irradiating the micro-LEDs to be transferred with laser from the first surface to lift-off the micro-LEDs to be transferred from the carrier substrate, wherein the protection layer is configured to protect the third surface from the irradiation of the laser,
   wherein the protection layer is formed on the third surface in a blanket manner without mask patterning and is conductive, and the protection layer covers the pads, and
   wherein the method further comprises:
   removing the protection layer between micro-LEDs on the third surface after lifting-off the micro-LEDs to be transferred.

2. A micro-LED transfer method, comprising:
   obtaining a carrier substrate, wherein the carrier substrate is laser-transparent and has a first surface and a second surface which is opposite to the first surface, and micro-LEDs to be transferred are formed on the second surface;
   forming a protection layer on a third surface of a receiving substrate, wherein the third surface of the receiving substrate is configured to receive the micro-LEDs to be transferred via pads;
   bringing the micro-LEDs to be transferred into contact with the pads on the third surface; and
   irradiating the micro-LEDs to be transferred with laser from the first surface to lift-off the micro-LEDs to be transferred from the carrier substrate, wherein the protection layer is configured to protect the third surface from the irradiation of the laser,
   wherein the protection layer is formed on the pads on the third surface and is conductive, and the protection layer on a pad has an area larger than that of the micro-LEDs to be transferred on the second surface.

3. A method for manufacturing a micro-LED device, comprising transferring micro-LEDs on a carrier substrate to a receiving substrate by using the micro-LED transfer method according to claim 1.

* * * * *